United States Patent [19]
Amanokura et al.

[11] Patent Number: 6,060,215
[45] Date of Patent: May 9, 2000

[54] PHOTOSENSITIVE RESIN COMPOSITION AND APPLICATION OF ITS PHOTOSENSITIVITY

[75] Inventors: Jin Amanokura; Fumihiko Ota; Ritsuko Obata; Toshihiko Akahori; Kenji Suzuki, all of Hitachi; Hiroshi Nishizawa, Kitaibaraki; Katsunori Tsuchiya, Hitachi; Takao Hirayama; Hiroaki Hirakura, both of Ibaraki-ken, all of Japan

[73] Assignee: Hitachi, Ltd., Tokyo, Japan

[21] Appl. No.: 09/049,056

[22] Filed: Mar. 27, 1998

[30] Foreign Application Priority Data

Mar. 31, 1997 [JP] Japan ..... 9-080417
Aug. 8, 1997 [JP] Japan ..... 9-214810

[51] Int. Cl.$^7$ ..... G03F 7/037
[52] U.S. Cl. ..... 430/281.1; 430/320; 430/328
[58] Field of Search ..... 430/281.1, 319, 430/328, 283.1, 320, 325

[56] References Cited

U.S. PATENT DOCUMENTS

| | | | |
|---|---|---|---|
| 4,777,115 | 10/1988 | Koch et al. | 430/281 |
| 5,236,809 | 8/1993 | Onodera et al. | 430/283 |
| 5,648,198 | 7/1997 | Shibata | 430/296 |

*Primary Examiner*—Janet Baxter
*Assistant Examiner*—Rosemary Ashton
*Attorney, Agent, or Firm*—Antonelli, Terry, Stout & Kraus LLP

[57] ABSTRACT

A photosensitive resin composition comprising (A) a resin having an amide bond, an oxyalkylene group and a carboxyl group, (B) a photopolymerizable compound having an ethylenically unsaturated group and (C) a photopolymerization initiator has an alkali developability, good sensitivity and photocurability, an efficient pattern formability by photolithography, a good application workability to a film and is capable of producing cured products having good folding endurance, solder reflow heat resistance, solvent resistance, bondability and nonflammability and suitable for producing a photosensitive element, a photosensitive laminate and a flexible printed circuit board.

15 Claims, No Drawings

PHOTOSENSITIVE RESIN COMPOSITION AND APPLICATION OF ITS PHOTOSENSITIVITY

BACKGROUND OF THE INVENTION

1) Field of the Invention

The present invention relates to a photo-sensitive resin composition, a process for producing a polyamide resin for use in the composition, a photosensitive element, a photosensitive laminate, and a process for producing a flexible printed circuit board.

2) Description of Related Art

For protection of an outerlayer circuit of a flexible printed circuit board, a coverlay formed by die-cutting a polyimide film, followed by heated pressure bonding or a cover coat formed by screen printing a polyimide resin ink has been so far used. The coverlay is limited in die-cut pattern micronization and thus is not applicable to a solder dam between QFP (quad flat package) pads at a narrower pitch. Furthermore, the coverlay is also limited in positional precision of lamination and thus there is a necessity for circuit designs with an allowance for a possible positional deviation. That is, the coverlay has such a problem as a failure to make FPC (flexible printed circuit board) higher in density and small in size. The cover coat, on the other hand, is limited likewise in pattern micronization due to the screen printing and also has such a problem as poor workability.

To overcome these problems, JP-A-64-2037, JP-A-64-484893, JP-A-5-158237 and JP-A-6-298935 propose processes for forming a coverlay with finer patterns by forming a photosensitive resin composition comprising a poly(amic acid)(polyimide precursor), a photocross-linking agent having an ethylenically unsaturated group and a photopolymerization initiator on a flexible printed circuit board, followed by light exposure, development and heating. However, the proposed processes have such problems as a failure to give the coverlay a necessary and sufficient thickness in respect to light transmission, a necessity for an additional step of heating to a temperature of 250° C. or higher to conduct ring closure of poly(amic acids) for forming an ultimate polyimide skeleton, inevitable oxidation of copper circuits, deterioration of adhesive layers, warping of substrate, etc.

Furthermore, JP-A-5-183260 proposes a process, which comprises forming a coverlay in double layer structure of thermoplastic polyimide and non-thermoplastic polyimide on a flexible printed circuit board by heated pressure bonding, forming a resist pattern thereon by screen printing and patterning the coverlay by alkali etching. JP-A-5-254064 proposes a process, which comprises laminating a double layer type film of a poly(amic acids)(polyimide precursor) layer and a photosensitive resin layer on a flexible printed circuit board, at first subjecting the photosensitive resin layer to light exposure and development to form a pattern, and successively patterning the poly(amic acid) layer by alkali etching, using the photosensitive resin layer as an etching resist. However, the former process is limited in pattern micronization due to the screen printing and also has such problems as a poor workability and a high cost due to the double layer structure of polyimide film. The latter process has such a work-ability problem as a necessity for the so called wet lamination and a separate development process each for the photosensitive resin layer and the poly(amic acid) layer, and furthermore has such problems as a necessity for an additional step for heating to a temperature of 250° C. or higher to conduct ring closure of poly(amic acid) for forming a final polyimide skeleton, inevitable oxidation of copper circuits, deterioration of adhesive layers, warping of substrate, etc.

From viewpoints of cost and environmental sanitation, it is preferable to use an aqueous inorganic alkali solution free from organic solvents as a developing solution, but almost all developing solutions applicable to the foregoing resin materials are organic solvents or semi-organic solvent systems based on mixtures of an organic solvent and an aqueous alkali solution.

On the other hand, JP-A-56-6498 and JP-A-59-230014 propose a process for producing a flexible printed circuit board, using an acrylic resin-based, photosensitive film so far employed in the field of printed wiring boards as a coverlay, where the coverlay can be readily formed at a low cost by a similar process to that for a dry film type permanent mask resist so far employed in the field of printed wiring (or circuit) boards, but both satisfactory flexibility and heat resistance or both satisfactory flexibility and solvent resistance cannot be obtained at the same time. JP-A-6-332171 proposes use of a photosensitive film based on a combination of acrylic resin and a specific urethane monomer as a coverlay film, where no satisfactory solvent resistance and electrical reliability can be obtained. No satisfactory nonflammability can be obtained with acrylic resin based, photosensitive films.

SUMMARY OF THE INVENTION

An object of the present invention is to provide a photosensitive resin composition having an alkali developability, an efficient pattern formability by photolithography and good sensitivity, photocurability and applicability to a film, which has overcome the drawbacks of the above-mentioned prior art, where the curing products have good folding endurance, solder reflow heat resistance, solvent resistance, adhesibility and nonflammability.

The present invention provides a photosensitive resin composition, which comprises (A) a resin having an amide bond, an oxyalkylene group and a carboxyl group, (B) a photopolymerizable compound having an ethylenically unsaturated group, and (C) a photopolymerization initiator.

The photosensitive resin composition, whose component (A) resin is a resin obtained by reaction of (a) a dicarboxylic acid having an oxyalkylene group, (b) a diisocyanate or diamine, (c) a compound having at least two epoxy groups in the molecule, and (d) a polybasic carboxylic monoanhydride as essential reactants is more effective.

The present invention also provides a photo-sensitive element obtained from the photosensitive resin composition, a photosensitive laminate and a process for producing a flexible printed circuit board.

DESCRIPTION OF THE PREFERRED EMBODIMENTS

Preferable embodiments of the present invention will be summarized as follows:

(1) A photosensitive resin composition, which comprises (A) a resin having an amide bond, an oxyalkylene group and a carboxyl group, (B) a photopolymerizable compound having an ethylenically unsaturated group and (C) a photopolymerization initiator.

(2) A photosensitive resin composition as described in (1), where the resin (A) is a resin obtained by reaction of (a) dicarboxylic acid having an oxyalkylene group, (b) diisocyanate or diamine, (c) a compound having at least two epoxy groups in the molecule and (d) a polybasic carboxylic monoanhydride as essential reactants.

(3) A photosensitive resin composition described in (1) or (2), where 20 to 95 parts by weight of the resin (A), 5 to 80 parts by weight of the photopolymerizable compound (B), sum total of the component (A) resin and the component (B) photopolymerizable compound being 100 parts by weight, and 0.01 to 20 parts by weight of the photopolymerization initiator (C) on the basis of sum total of the resin (A) and the photopolymerizable compound (B) as 100 parts by weight.

(4) A photosensitive element, which comprises a layer of a photosensitive resin composition as described in (1), (2) or (3) and a support film for supporting the layer.

(5) A photosensitive laminate, which comprises a substrate for a flexible printed circuit board and a layer of a photosensitive resin composition as described in (1), (2) or (3) on the surface of the substrate.

(6) A photosensitive laminate, which comprises a layer of a photosensitive resin composition as described in (1), (2) or (3), a substrate for a flexible printed circuit board on one surface of the layer and a support film on another surface of the layer.

(7) A process for producing a flexible printed circuit board, which comprises imagewise irradiating a photosensitive laminate as described in (5) or (6) with an actinic ray, followed by development, thereby forming a pattern of the photosensitive resin composition on the surface of the substrate for a flexible printed circuit board.

(8) A process for producing a flexible printed circuit board as described in (7), which further includes a step of irradiation with an actinic ray after the development and a step of post-heating.

The inventions as described in (1) and (2) provide photosensitive resin compositions having an alkali developability, an efficient pattern formability by photolithography and good sensitivity, photocurability and applicability to a film, where the curing products have good folding endurance, solder heat resistance, solvent resistance, adhesibility and nonflammability.

The invention as described in (3) provides a photosensitive resin composition having better effect, folding endurance and solder reflow heat resistance than those of the invention as described in (1).

The invention as described in (4) provides a photosensitive element having good sensitivity and, photocurability, efficient pattern formability by photolithography and good folding endurance, solder reflow heat resistance, solvent resistance, adhesibility, nonflammability, handling and laminatability to a substrate.

The invention as described in (5) provides a photosensitive laminate having good sensitivity and photocurability, efficient pattern formability by photolithography, and good folding endurance, solder reflow heat resistance, nonflammability, handling and productivity of flexible printed circuit boards.

The invention as described in (6) provides a photosensitive laminate having much better sensitivity and photocurability, efficient pattern formability by photolithography, good folding endurance, solder reflow heat resistance, solvent resistance, adhesibility and nonflammability, much better handling and good productivity of flexible printed circuit boards.

The invention as described in (7) provides a process for producing a flexible printed circuit board having good folding endurance, solder reflow heat resistance, solvent resistance and nonflammability and also good high density mountability and electrical reliability with good workability in good yield.

The invention as described in (8) provides a process for producing a flexible printed circuit board having an effect of the same level as that of the invention of (7) and a better solder reflow heat resistance than that of the invention of (7).

The present photosensitive resin composition comprises (A) a resin having an amide bond, an oxyalkylene group and a carboxyl group, (B) a photopolymerizable compound having an ethylenically unsaturated group and (C) a photopolymerization initiator.

A photosensitive resin composition, whose component (A) resin is a resin obtained by reaction of (a) dicarboxylic acid having an oxyalkylene group, (b) diisocyanate or diamine, (c) a compound having at least two epoxy groups in the molecule and (d) polybasic carboxylic monoanhydride, is more effective.

Preferably, the present photosensitive resin composition comprises (A) 20 to 95 parts by weight of the resin, (B) 5 to 80 parts by weight of the photopolymerizable compound, sum total of the resin (A) and the photopolymerizable compound (B) being 100 parts by weight, and (C) 0.01 to 20 parts by weight of the photopolymerization initiator on the basis of 100 parts by weight of the sum total of the resin (A) and the photopolymerizable compound (B).

In the present photosensitive resin composition, the amide bond in the resin (A) can be introduced by reaction of dicarboxylic acid having an oxyalkylene group with diisocyanate or diamine. Reaction of the resulting amide oligomer with a compound having at least two epoxy groups in the molecule can form a compound having a hydroxyl group due to the reaction of the carboxyl group of the amide oligomer with the epoxy groups.

The carboxyl group of the resin (A) can be introduced by reaction of the above-mentioned compound having a hydroxyl group with a polybasic carboxylic monoanhydride.

In the present invention, it is preferable to use a polyamide resin as resin (A), obtained, for example, by reacting dicarboxylic acid (a) having an oxyalkylene group with diisocyanate or diamine (b), thereby obtaining an amide oligomer, then reacting the amide oligomer with a compound (c) having at least two epoxy groups in the molecule, thereby obtaining a compound having a hydroxyl group, and then reacting the compound having a hydroxyl group with a polybasic carboxylic monoanhydride (d).

The dicarboxylic acid (a) having an oxyalkylene group for use in the present invention is not particularly limited and can include, for example, (1) Polyoxyalkyleneamidodicarboxylic acids obtained by reaction of polyoxyalkylene diamines (e.g. JEFFAMINE D-230, D-400, D-2000 and D-4000; JEFFAMINE ED-600, ED-900 and ED-2001; and JEFFAMINE EDR-148, represented by the following formulae, each of which is commercially available from Texaco Chemical Co., USA:

$$H_1NCHCH_2-[OCH_2CH]_{\overline{x}}-NH_2$$
$$\phantom{H_1NCHCH_2-}|\phantom{[OCH_2CH]_{\overline{x}}-}|$$
$$\phantom{H_1NCHCH_2}CH_3\phantom{[OC]}CH_3$$

| JEFFAMINE Product | X | Approx. Mol. Wt. |
|---|---|---|
| D-230 | 2.3 | 230 |
| D-400 | 5.6 | 400 |
| D-2000 | 33 (Avg.) | 2,000 |
| D-4000 | 68 (Avg.) | 4,000 |

$$H_2NCHCH_2-[OCHCH_2]_{\overline{a}}-[OCH_2CH_2]_{\overline{b}}-[OCH_2CH]_{\overline{c}}-NH_2$$
$$\phantom{H_2N}|\phantom{CHCH_2-[O}|\phantom{CHCH_2]_{\overline{a}}-[OCH_2CH_2]_{\overline{b}}-[OCH_2}|$$
$$\phantom{H_2N}CH_3\phantom{CHCH_2}CH_3\phantom{-[OCH_2CH_2]_{\overline{b}}-[OCH_2}CH_3$$

| JEFFAMINE Product | Approx. Value b | a + c | Approx. Mol. Wt. |
|---|---|---|---|
| ED-600 | 8.5 | 2.5 | 600 |
| ED-900 | 15.5 | 2.5 | 900 |
| ED-2001 | 40.5 | 2.5 | 2,000 |

$$H_2N-CH_2CH_2-O-CH_2CH_2-O-CH_2CH_2-NH_2$$

| JEFFAMINE | Approx. Mol. Wt. |
|---|---|
| EDR-148 | 148 | or bis-(3-aminopropyl)ether, 1,2-bis-(3-aminopropyl)-ethane, 1,3-bis-(3-aminopropyl)-2,2-dimethylpropane, α-ω-(3-aminopropyl)polyethyleneglycol, etc., each of which is commercially available from Kooei Kagaku Kogyo Co., Ltd., Japan) with well known dicarboxylic acids in a reactant equivalent weight ratio of carboxyl groups of di-carboxylic acid/amino groups of polyoxyalkylene diamine of more than 1;

(2) Polyoxyalkylenediimidodicarboxylic acids obtained by reaction of polyoxyalkylenediamine with tricarboxylic monoanhydride (e.g. trimellitic anhydride, tricarballylic anhydride, licinolic acid dehydrate adduct of maleic anhydride, sorbic acid dehydrate adduct of maleic anhydride, etc.) in a reactant equivalent weight ratio of acid anhydride groups of tricarboxylic monoanhydride/amino groups of polyoxyalkylenediamine of 1;

(3) Polyoxyalkylenepolyimidodicarboxylic acids obtained by reaction of polyoxyalkyleneimidodiamines (which are obtained by reaction of polyoxyalkylene-diamines with tetracarboxylic dianhydrides (e.g. pyromellitic anhydride, benzophenonetetracarboxylic dianhydride, s-biphenyltetracarboxylic dianhydride, diphenylsulfonetetracarboxylic dianhydride, methyl-cyclohexenetetracarboxylic dianhydride, ethylene glycol bisanhydrotrimellitate, etc.) in a reactant equivalent weight ratio of amino groups of polyoxyalkylenediamine/acid anhydride groups of tetracarboxylic dianhydride of more than 1) with the above-mentioned tricarboxylic monoanhydride in a reactant equivalent weight ratio of acid anhydride groups of tricarboxylic monoanhydride/amino groups of polyoxyalkyleneimidodiamine of 1;

(4) Polyoxyalkylene esters of dicarboxylic acids obtained by reaction of well known polyoxyalkylenediols with well known dicarboxylic acids in a reactant equivalent weight ratio of carboxyl groups of dicarboxylic acids/hydroxyl group of polyoxyalkylenediol of more than 1;

(5) Polyoxyethylenediglycolic acids (e.g. PEO acid #400, #1000, #4000, etc. each of which is commercially available from Kawaken Fine Chemical Co., Ltd., Japan); and so on.

Among them, (1) polyoxyalkyleneamidodicarboxylic acids, (2) polyoxyalkylenediimidodicarboxylic acids and (3) polyoxyalkylenepolyimidocarboxylic acids are preferable from the viewpoints of the hydrophilic property and heat resistance of the resulting polyamide resins.

The dicarboxylic acids having an oxyalkylene group can be used alone or in combination of at least two thereof.

The number of the oxyalkylene group in the dicarboxylic acids (a) having an oxyalkylene group may be one or more. In the latter case, the oxyalkylene groups are connected to one another in series. In any case, the molecular weight in total of the oxyalkylene group moiety is preferably 200 to 10,000, more preferably 500 to 5,000 and most preferably 1,000 to 3,000. Below 200, the hydrophic property and flexibility of the resulting resin (A) tend to decrease, whereas above 10,000 the heat resistance of the resulting resin (A) tends to decrease.

Either diisocyanate or diamine (b) may be used, but diisocyanate is preferable from the viewpoint of easy preparation of resin (A).

The diisocyanate for use in the present invention can include, for example, aromatic diisocyanates (e.g. 4,4'-diphenylmethane diisocyanate, 2,6-tolylene diisocyanate, 2,4-tolylene diisocynate, 1,5-naphthalene diisocyanate, tolidine diisocyanate, p-phenylene diisocyanate, 4,4'-diphenylether diisocyanate, m-xylylene diisocyanate, m-tetramethylxylylene diisocyanate, etc.); aliphatic diisocyanates (e.g. hexamethylene diisocyanate, 2,2,4-trimethylhexamethylene diisocyanate, 2,4,4-trimethylhexamethylene diisocyanate, lysine diisocyanate, etc.); alicyclic diisocyanates (e.g. isophorone diisocyanate, 4,4'-dicyclohexylmethane diisocyanate (hydrogenated 4,4'-diphenylmethane diisocyanate), transcyclohexane-1,4-diisocyanate, hydrogenated m-xylene diisocyanate, etc.); heterocyclic diisocyanate (e.g. 3,9-bis(3-isocyanatopropyl)-2,4,8,10-tetraspiro[5,5]undecane, etc.), and so on. These diisocyanates can be used alone or in combination of at least two thereof.

The diamine can include, for example, p-phenylenediamine, m-phenylenediamine, p-xylylenediamine, m-xylylenediamine, 4,4'-(or 3,4'- or 3,3'- or 2,4'- or 2,2'-)diaminodiphenylmethane, 4,4'- (or 3,4'- or 3,3'- or 2,4'- or 2,2'-)diaminodiphenylether, 4,4'- (or 3,4'- or 3,3'- or 2,4'- or 2,2'-)diaminodiphenylsulfone, 4,4'- (or 3,4'- or 3,3'- or 2,4'- or 2,2'-)diaminodiphenylsulfide, 4,4'-benzophenonediamine, 3,3'-benzophenonediamine, 2,2-bis[4-(4-aminophenoxy)phenyl]propane, 4,4'-diaminobenzanilide, etc. These diamines can be used alone or in combination of at least two thereof.

Aromatic diisocyanates are preferable from the viewpoint of the resulting polyamide resin.

The compound (c) having at least two epoxy groups in the molecule is not particularly limited, and can include, for example, bifunctional aromatic glycidyl ethers (e.g. bisphenol A type epoxy resin, tetrabromobisphenol A type epoxy resin, bisphenol F type epoxy resin, bisphenol AD type epoxy resin, naphthalene type epoxy resin, biphenyl type epoxy resin, tetramethylbiphenyl type epoxy resin, etc.); multifunctional aromatic glycidyl ethers (e.g. phenol novolak type epoxy resin, cresol novolak type epoxy resin, dicyclopentadienephenol type epoxy resin, tetraphenylolethane type epoxy resin, etc.); bifunctional aliphatic glycidyl ethers (polyethylene glycol type epoxy resin, polypropylene glycol type epoxy resin, neopentyl glycol type epoxy resin, dibromoneopentyl glycol type epoxy resin, hexanediol type epoxy resin, etc.); bifunctional alicyclic glycidyl ethers (e.g. hydrogenated bisphenol A type epoxy resin, etc.); multifunctional aliphatic glycidyl ethers (e.g. trimethylolpropane type epoxy resin, sorbitol type epoxy resin, glycerine type epoxy resin, etc.); bifunctional aromatic glycidyl esters (e.g. diglycidyl phthalate, etc.); bifunctional alicyclic glycidyl esters (e.g. diglycidyl tetrahydrophthalate, diglycidyl hexahydrophthalate, etc.); bifunctional aromatic glycidylamines (e.g. N,N,N',N'-tetraglycidyl-4,4'-diaminodiphenylmethane, 1,3-bis(N,N-glycidylaminomethyl)cyclohexane, N,N,O-triglycidyl-p-aminophenol, etc.); bifunctional alicyclic epoxy resins (e.g. alicyclic diepoxyacetal, alicyclicdiepoxyadipate, alicyclicdiepoxycarboxylate, vinylcyclohexane dioxide, etc.); bifunctional heterocyclic epoxy resins (e.g. diglycidylhydantoin, etc.); multifunctional heterocyclic epoxy resins (e.g. triglycidyl isocyanurate, etc.); bifunctional or multifunctional silicon-containing epoxy resins (e.g. organopolysiloxane type epoxy resin, etc.), and so on.

Among them, bifunctional epoxy resins are preferable from the viewpoint of easy control of reaction to produce hydrophilic polyamide resins. Among the bifunctional epoxy resins, bifunctional aromatic glycidyl ethers are more preferable from the viewpoint of the heat resistance of the resulting hydrophilic polyamide resins. Among them, bisphenol A types are preferable from the viewpoints of easy availability, low cost, etc., and bisphenol F type epoxy resins are particularly preferable from the viewpoint of increased solubility of the resulting hydrophilic polyamide resins in an aqueous alkali solution. These compounds can be used alone or in combination of at least two thereof.

The polybasic carboxylic monoanhydride (d) is not particularly limited, and can include, for example, tetrahydrophthalic anhydride, methyltetrahydrophthalic anhydride, trialkyltetrahydrophthalic anhydride, hexahydrophthalic anhydride, methylhexahydrophthalic anhydride, nadic anhydride, methylnadic anhydride, methyl-2-substituted butenyltetrahydrophthalic anhydride, itaconic anhydride, succinic anhydride, citraconic anhydride, dodecenylsuccinic anhydride, maleic anhydride, maleic anhydride adduct of methylcyclodiene, alkylated endoalkylenetetrahydrophthalic anhydride, phthalic anhydride, chlorendic anhydride, tetrachlorophthalic anhydride, tetrabromophthalic anhydride, tricarballylic anhydride, linolic acid dehydration product adduct of maleic anhydride, sorbic acid adduct of maleic anhydride, trimellitic anhydride, etc. Among them, tetrahydrophthalic anhydride is preferable from the viewpoints of reactivity, reaction yield, low cost, etc. These compounds can be used alone or in combination of at least two thereof.

Reactant equivalent weight ratio of dicarboxylic acid (a) having an oxyalkylene group to diisocyanate or diamine (b) (carboxyl groups of (a)/isocyanate groups or amino groups of (b)) is preferably 1.03–2, more preferably 1.05–1.7 and most preferably 1.1–1.5. Below 1.03, amide oligomers free from the carboxyl groups at both terminals are liable to be formed, thereby rendering the successive reaction with the compound (c) having at least two epoxy groups in the molecule difficult to occur, whereas above 2 the dicarboxylic acid (a) having an oxyalkylene group is liable to remain as unreacted, thereby lowering the heat resistance of the ultimate resin (A).

Reaction between the compounds (a) and (b) can be carried out in an organic solvent. The organic solvent is not particularly limited and can include, for example, lactones (e.g. γ-butyllactone, γ-caprolactone, etc.); carbonates (e.g. ethylenecarbonate, propylenecarbonate, etc.); ketones (e.g. methyl ethyl ketone, methyl isobutyl ketone, cyclohexanone, etc.); esters (e.g. ethyl acetate, n-butyl acetate, etc.); glymes (e.g. diglyme, triglyme, tetraglyme, etc.); hydrocarbons (e.g. toluene, xylene, cyclohexane, etc.); amides (e.g. N-methyl-2-pyrrolidone, N,N-dimethylacetamide, N,N-dimethylformamide, etc.); ureas (e.g. N,N-dimethylethylene urea, N,N-dimethylpropylene urea, tetramethyl urea, etc.); sulfones (e.g. sulfolane, etc.), and son on. Among them, organic solvents based on lactones as the main component are preferable owing to the distinguished low-temperature drying property during the film formation from a composition containing the resin (A) by heating.

The organic solvent can be used in an amount of preferably 30 to 2,000 parts by weight, more preferably 50 to 1,000 parts by weight and most preferably 70 to 400 parts by weight on the basis of 100 parts of sum total of the components (a) and (b). Below 30 parts by weight the organic solvent shows an insufficient solubility and tends to make the reaction system uneven or highly viscous, whereas above 200 parts by weight the reaction tends to proceeds much slowly with hard completion of reaction. These organic solvents can be used alone or in combination of at least two thereof.

Reaction temperature for the components (a) and (b) is preferably 100° to 300° C., more preferably 150° to 270° C., and most preferably 170° to 250° C. Below 100° C. the reaction tends to proceed much slowly with hard completion of reaction, whereas above 300° C. gel formation, etc. are liable to take place due to side reactions and the reaction will be less controllable.

In the production of amide oligomers by reaction of component (a) with component (b), the dicarboxylic acid (a) having an oxyalkylene group can be partly replaced with a dicarboxylic acid (a') having no oxyalkylene group. The dicarboxylic acid (a') having no oxyalkylene group for use in the replacement is not particularly limited and can include well known dicarboxylic acids, for example, alicyclic dicarboxylic acids (e.g. succinic acid, glutaric acid, adipic acid, pimelic acid, azelaic acid, sebacic acid, dodecanedioic diacid, eicosanedioic acid, dimer acid, 1,4-cyclohexanedicarboxylic acid, etc.); aromatic dicarboxylic acids (e.g. isophthalic acid, tetraphthalic acid, phthalic acid, 1,5-naphthalenedicarboxylic acid, 4,4'-diphenyletherdicarboxylic acid, 4,4'-diphenylsulfonedicarboxylic acid, 4,4'-benzophenonedicarboxylic acid, etc.), and so on. Besides, dicarboxylic acids having a carbonate-diol bond may be used. The dicarboxylic acid having such a carbonate-diol bond can be synthesized by reaction of polycarbonate-diol with dicarboxylic acid in a reactant equivalent weight ratio of carboxyl groups of dicarboxylic acid/hydroxyl groups of polycarbonatediol of more than 1.

Dicarboxylic acid (a') having no oxyalkylene group can be used in an amount of preferably 5 to 90 parts by weight, more preferably 10 to 70 parts by weight and most preferably 20 to 50 parts by weight on the basis of 100 parts by weight of sum total of components (a) and (a'). Above 90 parts by weight of the component (a'), the hydrophilic property of the resulting resin (A) will be lowered and, when used as a binder component in the photosensitive resin composition, the alkali developability of the photosensitive resin composition tends to decrease and also the flexibility tends to decrease. These dicarboxylic acids (a') having no oxyalkylene group can be used alone or in combination of at least two thereof.

In the reaction of amide oligomers obtained by reaction of the component (a) with the component (b) with a compound (c) having at least two epoxy groups in the molecule to obtain a compound having a hydroxyl group, a reactant equivalent weight ratio of the compound (c) having at least two epoxy groups in the molecule to the amide oligomer (epoxy groups of (c)/carboxyl groups of the amide oligomer) is preferably 0.5–3, more preferably 1.1–2.5 and most preferably 1.2–2.0. Below 0.5, a higher molecular weight is hard to obtain and the heat resistance and flexibility of the ultimate resin (A) tend to decrease, whereas above 3 gel formation, etc. are liable to take place due to side reaction and reaction will be less controllable, and furthermore the cross-linking density tends to increase, thereby lowering the flexibility of the ultimate resin (A).

In the step of producing the compound having a hydroxyl group, the reaction of amide oligomers with the component (c) following the previous step of producing the amide oligomers can be carried out in an organic solvent. The organic solvent for use in the reaction is not particularly limited and such organic solvents as used in the previous step of producing the amide oligomers can be used as they are.

When a solvent based on lactones as the main component is used in the previous step of producing the amide oligomers, it is preferable from the viewpoints of solubility and low-temperature drying property of the ultimate resin (A) to use amides, above all, low boiling point N,N-dimethylformamide at the same time.

The organic solvent can be used in an amount of preferably 30 to 2,000 parts by weight, more preferably 50 to 1,000 parts by weight and most preferably 70 to 400 parts by weight on the basis of 100 parts by weight of sum total of the oligomer and the component (c). Below 30 parts by weight, the organic solvent shows an insufficient solubility and tends to make the reaction system uneven or highly viscous, whereas above 2,000 parts by weight the reaction tends to proceed much slowly with hard completion of reaction. These organic solvents can be used alone or in combination of at least two thereof.

Reaction temperature for the amide oligomer and the component (c) in the step of producing a compound having a hydroxyl group is preferably 50°–250° C., more preferably 100°–200° C. and most preferably 120°–180° C. Below 50° C. the reaction tends to proceed much slowly with hard completion of reaction, whereas above 250° C. gel formation, etc. tend to take place due to side reactions and the reaction will be less controllable.

The compound having a hydroxyl group sometimes has an epoxy group at the terminal. In that case, the resulting compound having the hydroxyl group may be subjected to reaction with a monocarboxylic acid to remove the epoxy group from the compound having a hydroxyl group. The monocarboxylic acid for use in the epoxy group-removing reaction is not particularly limited and can include, for example, aliphatic monocarboxylic acids having a photopolymerizable unsaturated group (e.g. methacrylic acid, acrylic acid, etc.); aliphatic monocarboxylic acids (e.g. formic acid, acetic acid, propionic acid, butyric acid, hexanoic acid, etc.); aromatic monocarboxylic acids (e.g. benzoic acid, diphenylacetic acid, etc.), and so on. Among them, monocarboxylic acids having a photopolymerizable unsaturated group are preferable from the viewpoint of a possibility to give the photocurability to the ultimate resin (A). These monocarboxylic acids can be used alone or in combination of at least two thereof.

In the reaction of the compound having a hydroxyl group with a monocarboxylic acid, a reactant equivalent ratio of the monocarboxylic acid to the compound of a hydroxyl group (carboxylic groups of the monocarboxylic acid/epoxy groups of the compound having a hydroxyl group) is preferably 0.5–5, more preferably 0.8–2 and most preferably 1–1.2. Below 0.5 unreacted epoxy groups tend to remain with decreased preservation stability of the resin (A), whereas above 5 unreacted monocarboxylic acid tends to remain in a large amount with increased skin irritation.

In the step of producing polyamide resin by reaction of the compound having a hydroxyl group with a polybasic carboxylic monoanhydride (d), a reactant equivalent weight ratio of the polybasic carboxylic monoanhydride (d) to the compound having a hydroxyl group (acid anhydride groups of (d)/hydroxyl groups of the compound having a hydroxyl group) is preferably 0.1–1.5, more preferably 0.3–1 and most preferably 0.6–0.9. Below 0.1, the resulting polyamide resin is less soluble in an aqueous alkali solution and when used as a polymer component for a photosensitive resin composition the alkali developability of the photosensitive resin composition tends to decrease, whereas above 1.5 the polybasic carboxylic monoanhydride is liable to remain in a large amount as unreacted with decreased preservation stability of polyamide resin.

The reaction of the compound having a hydroxyl group with the component (d) following the previous step of producing the compound having a hydroxyl group can be carried out in an organic solvent. The organic solvent for use in the reaction is not particularly limited and for example such organic solvents as used in the step of producing amide oligomers can be used as they are. When a solvent based on a mixture of lactones and amides as the main component is used in the previous step of producing the compound having a hydroxyl group, it is not particularly necessary to add any organic solvent thereto.

The organic solvent can be used in an amount of preferably 30 to 2,000 parts by weight, more preferably 50 to 1,000 parts by weight and most preferably 70 to 400 parts by weight on the basis of 100 parts by weight of sum total of the compound having a hydroxyl group and the component (d). Below 30 parts by weight the organic solvent shows an insufficient solubility and tends to make the reaction system uneven or highly viscous, whereas 2,000 parts by weight the reaction tends to proceed much slowly with hard completion of reaction. These organic solvent can be used alone or in combination of at least two thereof.

Reaction temperature for the compound having a hydroxyl group and the component (d) is preferably 40° to 250° C., more preferably 60° to 200° C. and most preferably 80° to 180° C. Below 40° C. the reaction tends to proceed much slowly with hard completion of reaction, whereas above 250° C. gel formation, etc. are liable to take place due to side reactions and the reaction will be less controllable.

After the production of the compound having a hydroxyl group and/or after the production of the polyamide resin, the compound having a hydroxyl group and/or the polyamide resin may be reacted with an aliphatic monoisocyanate having a photopolymerizable unsaturated group to give a photocurability to the polyamide resin, and the resulting product can be used as resin (A).

The aliphatic monoisocyanate having a photopolymerizable unsaturated group for use in the reaction is not particularly limited, and can include, for example, 2-isocyanatoethyl methacrylate, methacryloyl isocyanate, etc. and can be used alone or in combination of at least two thereof.

When the aliphatic monoisocyanate having a photopolymerizable unsaturated group is used, a reactant equivalent weight ratio of the aliphatic monoisocyanate to the compound having a hydroxyl group and/or the polyamide resin (isocyanate groups of the aliphatic monoisocyanate having a photopolymerizable unsaturated group/hydroxyl groups of the compound having a hydroxyl group and/or polyamide resin) is preferably 0.05–1.5, more preferably 0.1–1 and most preferably 0.1–0.4. Below 0.05 the photocurability will be lower and when used as a polymer component for the photosensitive resin composition the sensitivity of the photosensitive resin composition tends to decrease, whereas above 1.5 the aliphatic monoisocyanate having a photopolymerizable unsaturated group is liable to remain as unreacted with decreased preservation stability.

In the foregoing reactions, a reaction catalyst can be used as desired. The reaction catalyst is not particularly limited and includes, for example, tertiary amines (e.g. triethylamine, triethylenediamine, N,N-dimethylaniline, N,N-diethylaniline, N,N-dimethylbenzylamine, N-methylmorpholine, N-ethylmorpholine, N,N-dimethylpiperazine, pyridine, picoline, 1,8-diazabicyclo-[5, 4,0] undecene-7, etc.); imidazoles (e.g. 2-methylimidazole, 2-ethylimidazole, 2-ethyl-4-methylimidazole, 2-methyl-4-methylimidazole, 1-cyanoethyl-2-methylimidazole, 1-cyanoethyl-2-phenylimidazole, 2-phenyl-4-methyl-5-hydroxymethylimidazole, 2-phenyl-4,5-dihydroxymethylimidazole, 1-azine-2-methylimidazole, etc.); organotin compounds (e.g. dibutyltin dilaurate, 1,3-diacetoxytetrabutyldistannoxane, etc.); quaternary ammonium salts (e.g. tetraethylammonium bromide, tetrabutylammonium bromide, benzyltriethylammonium chloride, trioctylmethylammonium chloride, etyltrimethylammonium bromide, tetrabutylammonium iodide, dodecyltrimethylammonium iodide, benzyldimethyltetradecylammonium acetate, etc.); quaternary phosphonium salts (e.g. tetraphenylphosphonium chloride, triphenylmethylphosphonium chloride, tetramethylphosphonium bromide, etc.); organophosphorus compounds (e.g. 3-methyl-1-phenyl-2-phospholene-1-oxide, etc.); organic acid alkali metal salts (e.g. sodium benzoate, potassium benzoate, etc.); inorganic salts (e.g. zinc chloride, iron chloride, lithium chloride, lithium bromide, etc.); metal carbonyls (e.g. octacarbonyl-dicobalt (cobalt carbonyl, etc.), and so on. These reaction solvents can be used alone or in combination of at least two thereof.

The polyamide resin obtained according to the foregoing process is hydrophilic and can be widely used as a polymer component for an alkali-developable type, photosensitive resin composition for various applications including solder resists for printed wiring boards, photosensitive coverlay films, color filter materials for liquid crystals, heat-resistant materials for electronic parts, etc.

The resin (A) so produced has a chemical structure represented by the following general formula (I):

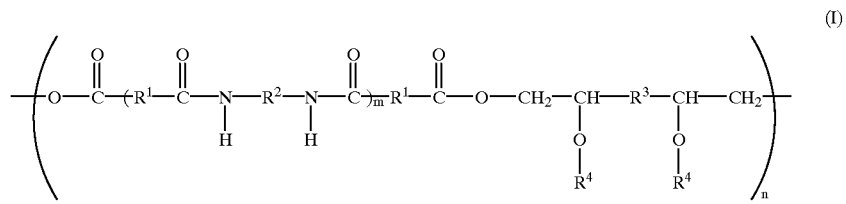

where $R^1$ shows a divalent residue resulting from removal of two carboxyl groups from a dicarboxylic acid having an oxyalkylene group; $R^2$ shows a diamine residue or diisocyanate residue; $R^3$ shows a divalent residue resulting from removal of two epoxy groups from a compound having at least two epoxy groups in the molecule; $R^4$ shows a hydrogen atom, a group represented by the following formula:

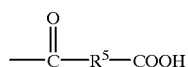

(where $R^5$ shows a residue of multibasic carboxylic monoanhydride) or a group represented by the following formula:

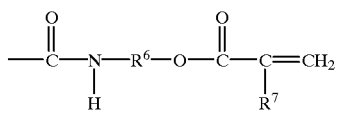

(where $R^6$ is an alkylene group having 1 to 6 carbon atoms or a single bond and $R^7$ is a hydrogen atom or a methyl group); and n and m shows each independently an integer of 1 to 100.

The chemical structure represented by the foregoing chemical formula (I) are free from the terminal moieties of the resin. Chemical structures with the terminal moieties are represented by the following chemical formula (I-1) to (I-3):

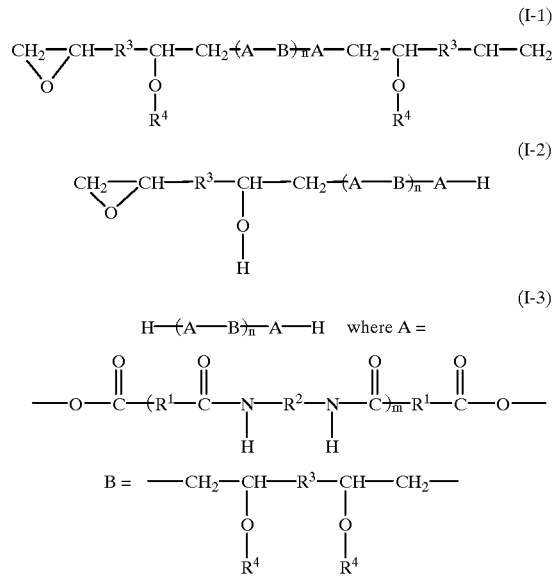

and $R^1$, $R^2$, $R^3$, $R^4$, m and n have the same meanings as defined in the general formula (I).

The resin represented by the foregoing general formula (I-1) has epoxy groups at both terminals; the resin represented by the foregoing general formula (I-2) has an epoxy group at one terminal and a carboxyl group at another; and the resin represented by the foregoing general formula (I-3) has carboxyl groups at both terminals. The epoxy group(s) at the terminal(s) of the resins may be partially or entirely modified by reaction with a monocarboxylic acid such as methacrylic acid, acrylic acid, acetic acid, propionic acid, etc.

Usually, the resin as produced is a mixture of these resins and it is preferable that the resin as produced contain at least 20% by weight of the resin represented by the general formula (I-1) or the resin whose terminal epoxy groups are modified by reaction with the monocarboxylic acid. This can be attained by adjusting proportions of the individual components for use in the production of the resin.

Weight-average molecular weight of resin (A) (determined by GPC, using an element based on an equal volume solvent mixture of dimethylformamide (DMF) and tetrahydrofuran (THF) containing lithium monohydrate and phosphoric acid adjusted to concentrations of 0.03 mole/l and 0.06 mole/l, respectively, as buffers, and calculated in terms of polystyrene from a calibration curve prepared with standard polystyrene) is preferably 10,000–500,000, more preferably 20,000–200,000 and most preferably 30,000–100,000 from the viewpoints of tackiness, solder reflow heat resistance, solvent resistance, folding endurance, adhesibility, application workability, etc.

The photopolymerizable unsaturated compound having an ethylenically unsaturated group for use as component (B) in the present photosensitive resin composition is not particularly limited and can include well known compounds, for example, acrylates or methacrylates of polyhydric alcohols (e.g. diethyleneglycol dimethacrylate, tetraethyleneglycol diacrylate, hexapropyleneglycol diacrylate, trimethylolpropane triacrylate, pentaerythritol triacrylate, 1,6-hexanediol diacrylate, 1,9-nonanediol diacrylate, dipentaerythritol pentacrylate, trimethylolpropane trimethacrylate, etc.); epoxyacrylates (e.g. 2,2-bis(4-methacryloxyethoxyphenyl)-propane, 2,2-bis(4-acryloxyethoxyphenyl)propane, bisphenol A, acrylic acid or methacrylic acid adduct of epoxy resins of epichlorohydrin series, etc.); acrylates or methacrylates having a benzene ring in the molecule (e.g. low molecular weight unsaturated polyesters of condensates of phthalic anhydride/neopentylglycol/acrylic acid in a molar ratio of 1:2:2, etc., and so on); acrylic acid or methacrylic acid adducts of trimethylolpropanetriglycidyl ether, urethane acrylate compounds or urethane methacrylate compounds obtained by reaction of trimethylhexamethylene diisocyanate, dihydric alcohol and acrylic acid monoester or methacrylic acid monoester, methoxypolyethyleneglycol acrylate, methoxypolyethyleneglycol methacrylate, methoxypolypropyleneglycol acrylate, methoxypolypropyleneglycol methacrylate, phenoxypolyethyleneglycol acrylate, phenoxypolyethyleneglycol methacrylate, phenoxypolypropyleneglycol acrylate, phenoxypolypropyleneglycol methacrylate, nonylphenoxypolyethyleneglycol acrylate, nonylphenoxypolyethyleneglycol methacrylate, nonylphenoxypolypropyleneglycol acrylate, nonylphenoxypolypropyleneglycol methacrylate, etc. Bisphenol A polyoxyethylene dimethacrylate is preferable from the viewpoint of flexibility as a coverlay. These compounds can be used alone or in combination of at least two thereof.

The photopolymerization initiator for use as component (C) in the present photosensitive resin composition is not particularly limited and can include well known ones, for example, aromatic ketones (e.g. benzophenone, 4,4'-bis(dimethylamino)benzophenone (Michler's ketone), 4,4'-bis(diethylamino)benzophenone, 4-methoxy-4'-dimethylamino-aminobenzophenone, 2-benzyl-2-dimethyl-1-(4-morpholinophenyl)-butanone-1, 2-ethylanthraquinone, phenanthrenequinone, etc.); benzoin ethers (e.g. benzoin methyl ether, benzoin ethyl ether, benzoin phenyl ether, etc.); benzoin (e.g. methylbenzoin, ethylbenzoin, etc.); benzyl derivatives (e.g. benzyldimethylketal, etc.); 2,4,5-triarylimidazole dimers (e.g. 2-(o-chlorophenyl)-4,5- diphenylimidazole dimer, 2-(o-chlorophenyl)-4,5-di(m-methoxyphenyl)imidazole dimer, 2-(o-fluorophenyl)-4,5-phenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer, etc.); acridine derivatives (e.g. 9-phenylacridine, 1,7-bis(9,9'-acridinyl)heptane, etc.); N-phenylglycine, etc. These compounds can be used alone or in combination of at least two thereof.

Mixing proportion of the individual components (A), (B) and (C) in the present photosensitive resin composition is preferably 20 to 95 parts by weight of component (A), 5 to 80 parts by weight of component (B) (sum total of components (A) and (B) being 100 parts by weight) and 0.01 to 20 parts by weight of the photopolymerization initiator as component (C) on the basis of 100 parts by weight of sum total of components (A) and (B).

Below 20 parts by weight of component (A) in the present photosensitive resin composition, the film formability tends to decrease, when formed into a photosensitive element, whereas above 95 parts by weight the circuit coverage or solder reflow heat resistance of a coverlay tends to decrease when the present photosensitive resin composition is formed into a photosensitive element, followed by heated pressure bonding of the photosensitive element to the wiring-formed surface of a flexible printed circuit board to form the coverlay. Proportion of component (A) is more preferably 30 to 90 parts by weight and most preferably 40 to 90 parts by weight.

Below 5 parts by weight of component (B) the sensitivity of the present photosensitive resin composition is low and when such a photosensitive resin composition is formed into a photosensitive element, followed by heated pressure bonding of the photosensitive element to the wiring-formed surface of a flexible printed circuit board to form a coverlay, the circuit coverage of the coverlay tends to decrease, whereas above 80 parts by weight the flow of the photosensitive layer, when formed into a photosensitive element is liable to lead to bleeding from the sides of the photosensitive element, and the preservation stability tends to decrease. Proportion of component (B) is more preferably 10 to 70 parts by weight.

Below 0.01 part by weight of component (C) in the present photosensitive resin composition any satisfactory sensitivity can be hardly obtained, whereas above 20 parts by weight the light absorption on the light-exposed surface of the photosensitive resin composition tends to increase, resulting in insufficient interior photocuring. Proportion of component (C) is more preferably 0.05 to 10 parts by weight.

To reduce the tackiness or edge fusion, polyvinylpyrrolidone may be added to the present photosensitive resin composition. The polyvinylpyrrolidone for use in the present invention can include, for example, polyvinylpyrrolidone K120, etc. commercially available from ISP Co., Ltd.

Weight-average molecular weight of polyvinylpyrrolidone is preferably 10,000–3,000,000. Proportion of polyvinylpyrrolidone is 1 to 20 parts by weight on the basis of 100 parts by weight of sum total of components (A), (B) and (C).

Below one parts by weight the effect of reducing tackiness or edge fusion will be lower, whereas above 20 parts by weight the heat resistance will be lowered.

A plasticizer may be added to the present photosensitive resin composition. The plasticizer for use in the present invention is not particularly limited and can include, for example, p-toluenesulfonamide, toluenesulfone-N-ethylamide, p-toluenesulfone-N-cyclohexylamide, di(2-ethylhexyl) phthalate, dibutyl phthalate, dinonyl phthalate, di(2-ethylhexyl) adipate, dibutyl adipate, di(2-ethylhexyl) sebacate, dibutyl sebacate, tributyl acetylcitrate, (2-ethylhexyl) azelate, dibutyl azelate, triphenyl phosphate, tricresyl phosphate, diethylene glycol monoleate, epoxy-aliphatic acid ester, methylstearate methoxychloride, tri(2 -ethylhexyl) trimellitate, trialkyl trimellitate, etc. p-Toluenesulfoneamide is preferable from the viewpoint of resist form and compatibility with component (A), polyvinylpyrrolidone, etc.

Proportion of the plasticizer is preferably 1 to 20 parts by weight on the basis of 100 parts by weight of sum total of components (A), (B) and (C). Below one part by weight the flexibility-endowing effect will be lower, whereas above 20 parts by weight the heat resistance will be lowered.

It is preferable from the viewpoint of increasing the solvent resistance, etc. to add a heat cross-linking agent to the present photosensitive resin composition. The heat cross-linking agent for use in the present invention can include, for example, melamine compounds, block type polyisocyanate compounds, etc.

Melamine compounds include melamines commercially available from American Cyanamid Co., USA or Mitsui Cytec, Ltd., Japan, for example, benzoguanamine such as Cymel (registered trademark) 300, 301, 303, 350, 370, 380, 1116 and 1130 and Cymel (registered trademark) 1123 and 1125; glycolyl resin Cymel (registered trademark) 1170, 1171 and 1172; and urea-based resin Beetle (registered trademark) 60, 65 and 80.

Block-type polyisocyanate compounds include Coronate 2513, 2507, 2515 and 2512 commercially available from Nihon Polyurethane Kogyo K.K., Japan and Desmodur BL3175, BL4165, etc. commercially available from Sumitomo Bayer Urethane K.K., Japan.

Proportion of the heat cross-linking agent is preferably 1 to 30 parts by weight on the basis of 100 parts by weight of sum total of components (A), (B) and (C). Below one part by weight the effect of increasing the solvent resistance will be lower, whereas above 30 parts by weight the photocurability, heat stability, etc. will be lowered.

To improve the nonflammability, a flame retardant can be added to the present photosensitive resin composition. The flame retardant for use in the present invention can include halogen-based compounds (e.g. FG-7000, FG-7500, FG-8100, FG-3600, FG-3200, FG-3100, FG-3000 and FG-2000 commercially available from Teijin Chemicals Ltd., Japan; TAIC-6B, etc. commercially available from Nippon Kasei Chemical Co., Ltd., Japan); halogenated phosphate ester compounds (e.g. CR-380, CR-509, CR-900, etc. commercially available from Daihachi Kagaku Kogyo K.K., Japan); aromatic phosphate ester compounds (e.g. Fosflex 580, Fosflex 112, and Fosflex 574 commercially available from Akuzo Kashima K.K., Japan; CR733S, CR741, CR747, PX200, PX201, PX202, etc. commercially available from Daihachi Kagaku Kogyo K.K., Japan), and so on. Likewise, a flame retardant aid (e.g. antimony trioxide, antimony pentaoxide, barium borate, aluminum hydroxide, etc.) can be added thereto.

Proportion of the flame retardant is preferably 1 to 50 parts by weight on the basis of 100 parts by weight of sum total of components (A), (B) and (C). Proportion of the flame retardant aid is preferably 1 to 80 parts by weight on the basis of 100 parts by weight of sum total of components (A), (B) and (C), and below one part by weight the effect of improving the nonflammability will be lower, whereas above 80 parts by weight the photocurability, heat-resistance, solvent resistance, etc. will be lowered.

A dye such as malachite green, etc., a color coupler, a pigment, a stabilizer, an adhesive, etc. may be added, if required to the present photosensitive resin composition. Proportion each of these additives is preferably not more than 2 parts by weight on the basis of 100 parts by weight of sum total of components (A), (B) and (C).

the present photosensitive resin composition can be made into a uniform solution by dissolution in and mixing with a solvent capable of dissolving the components (A), (B) and (C) (e.g. toluene, acetone, methyl ethyl ketone, methyl isobutyl ketone, methyl Cellosolve, ethyl Cellosolve, γ-butyllactone, N-methylpyrrolidone, dimethylformamide, tetramethylsulfone, diethyleneglycol dimethyl ether, chloroform, methylene chloride, methyl alcohol, ethyl alcohol, etc.).

The present photosensitive resin composition, when formed into a solution state by the dissolution, can be applied as a liquid coating composition to substrates or supports by an ordinary application method including screen printing, flow coating, roller application, slot coating, spin coating, curtain coat, spray coating, dip coating, etc. In that case, the viscosity of the liquid coating composition can be adjusted, if required, with a solvent, a thickening agent, a filler, etc. to satisfy the requirements imposed by the individual application methods. After the application to substrates or supports, the liquid coating layer is dried to remove the solvent.

A photosensitive element can be obtained by applying the present photosensitive resin composition to a support, followed by drying. The support for use in the present invention can include polymer films such as films of polyethylene terephthalate, polypropylene, polyethylene, etc., among which polyethylene terephthalate is preferable. These polymer films are to be later removed from the photosensitive layer and thus must not be the surface-treated ones or materials that are impossible to remove. The thickness of the polymer films is usually 5–100 μm, preferably 10–30 μm. One polymer film as a support film for the photosensitive layer and another polymer film as a protective film for the photosensitive layer may be laid on one side and another side of the photosensitive layer, respectively, by lamination.

Furthermore, a laminate can be obtained by applying the present photosensitive resin composition to a support, followed by drying to form a photosensitive layer, as described above, and pressure bonding the photosensitive layer to a wiring-formed, flexible printed circuit board.

Furthermore, the present laminate can be wound up into a rolled form for storage.

To form a photoresist pattern, using the present photosensitive element, the protective film, when present in the element, is removed from the photosensitive element and then the photosensitive layer is pressure bonded to the substrate with heating to conduct lamination. To make a flexible printed circuit board, the surface subject to lamination is usually a wiring-etch formed side of the flexible printed circuit board, but is not particularly limited. Heated pressure bonding of the photosensitive layer is carried out usually at a temperature of 90°–130° C. under a bonding pressure of $3.0 \times 10^5$ Pa. To further improve the conformity of the photosensitive layer with the flexible printed circuit board, it is preferable to carry out heated pressure bonding in a reduced pressure atmosphere of not more than $4 \times 10^3$ Pa in addition to the above-mentioned conditions. In case of heated pressure bonding in the reduced pressure atmosphere, it is preferable to use a vacuum laminator in such a structure as to be capable of heated pressure bonding in a vacuum chamber. So long as the photosensitive layer can be heated as above, it is not necessary to preheat the substrate, but to further improve the conformity, it is also possible to conduct a preheating treatment of the substrate. Still furthermore, through a continuously laminating step of continuously reeling off the rolled flexible printed circuit board sheet and heated pressure bonding the photosensitive layer to the reeled-off flexible printed circuit board sheet, the photosensitive layer-laminated flexible printed circuit board sheet can be wound up into a rolled form. To further improve the conformity of the photosensitive layer with the flexible printed circuit board in the step of continuously laminating the photosensitive layer, it is preferable to carry out heated pressure bonding in a reduced pressure atmosphere of not more than $4 \times 10^3$ Pa using a vacuum laminator.

The laminated photosensitive layer is then subjected to patternwise exposure to an actinic ray through a negative or positive film. In the case that the polymer film on the photosensitive layer is transparent, the exposure to the actinic ray can be carried out as such, but in the case of the opaque polymer film, such opaque film must be removed from the photosensitive layer before the exposure to the actinic ray. It is preferable from the viewpoint of photosensitive layer protection that the polymer film is transparent and the exposure to the actinic ray is carried out through the transparent polymer film without removing the film. The actinic ray for use in the present invention can include actinic rays from well known actinic ray sources (e.g. carbon arc, mercury vapor arc, xenon arc and others). In addition thereto, such actinic ray sources as a photographic flood incadescent lamp, a solar lamp, etc. can be used.

Patternwise actinic ray-exposed layer of the present photosensitive resin composition can be heated after the exposure in order to induce or promote cross-linking of the actinic ray-exposed part. Heating after the exposure can be carried out, for example, at a temperature of about 85° to about 110° C. for about 5 to 60 minutes.

After the exposure to the actinic ray, the polymer film, when present on the photosensitive layer, is removed from the photosensitive layer, and then the unexposed parts are removed by a well known method including spraying, shaking immersion, brushing, scrubbing, etc., using a well known developing agent such as an aqueous alkali solution, an aqueous surfactant solution, etc. for development.

The base for use in the aqueous alkali solution can include alkali hydroxides (e.g. hydroxides of lithium, sodium or potassium or the like); alkali carbonates (e.g. carbonates or bicarbonates of lithium, sodium or potassium or the like); alkali metal phosphates (e.g. potassium phosphate, sodium phosphate, etc.); alkali metal pyrophosphates (e.g. sodium pyrophosphate, potassium pyrophosphate, etc.) and so on. Above all, an aqueous solution of sodium carbonate is preferable. pH of the aqueous alkali solution for use in the development is preferably in a range of 9 to 11, and the temperature is adjusted to meet the developability of the photosensitive layer. A surfactant, a defoaming agent, a small amount of an organic solvent, etc. can be added to the aqueous alkali solution.

The surfactant for use in the aqueous surfactant solution is not particularly limited and can include an anionic surfactant, a cationic surfactant and a nonionic surfactant.

The anionic surfactant for use in the present invention can include sodium lauryl alcohol sulfate ester, sodium oleyl alcohol sulfate ester, sodium lauryl sulfate, ammonium lauryl sulfate, sodium dodecyl benzene sulfonate, etc.; the cationic surfactant can include, for example, stearylamine hydrochloride, lauryltrimethylammonium chloride, alkylbenzenedimethylammonium chloride, etc.; and the nonionic surfactant can include, for example, polyoxyethylenealkyl ether, polyoxyethylenearyl ether, polyoxyethylenealkylaryl ether, polyoxyethylene derivatives, oxyethyleneoxypropylene block copolymers, sorbitan fatty acid esters, glycerine fatty acid esters, polyoxyethylene fatty acid esters, polyoxyethylenealkylamines, etc. Above all, polyoxyethylenearyl ether, polyoxyethylenealkylaryl ether, polyoxyethelene derivatives, etc. of nonionic surfactant are preferable.

Concentration of the surfactant is preferably 0.01–15% by weight, more preferably 0.1–10% by weight and most preferably 0.5–5% by weight.

After the development, irradiation with an actinic ray from a high pressure mercury lamp, etc. can be carried out to improve the solder reflow heat resistance and chemical resistance of a coverlay for the flexible printed circuit board. Irradiation dose of the actinic ray is about 0.2 to about 10 J/cm$^2$ and the irradiation can be carried out also with heating at 60°–180° C.

After the development, heating may be carried out for the same purpose. It is preferable to carry out heating at a temperature of about 100° to about 180° C. for 15 to 90 minutes. The step of irradiation with an actinic ray and the step of heating may be both carried out in any sequence.

The present invention will be described in detail below, referring to Examples.

SYNTHESIS EXAMPLE 1

Synthesis of dicarboxylic acid having an oxyalkylene group 1,000 parts by weight of polyoxypropylenediamine (JEFFAMINE D-2000, trademark of a product commercially available from Texaco Chemical Co., USA, having 33 oxypropylene units on average in one molecule and a weight-average molecular weight of 2,000) and 192 parts by weight of trimellitic anhydride were charged into a flask provided with a stirrer, a thermometer, a cooling tube, a distillate tube and a nitrogen gas inlet tube and heated to 200° C. over one hour in a nitrogen gas stream while distilling off by-produced water of condensation through azeotropic distillation with toluene. The reaction mixture was kept at 200° C. for 2 hours to complete the dehydration-imidization reaction, and then cooled to obtain polyoxyalkylenedimidodicarboxylic acid.

SYNTHESIS EXAMPLE 2

Synthesis of dicarboxylic acid having an oxyalkylene group 1,000 parts by weight of poly(oxyethylene·oxypropylene) diamine (JEFFAMINE ED-2001, trademark of a product commercially available from Texaco Chemical Co., USA, having 40.5 oxyethylene units and 3.5 oxypropylene units on average in one molecule and a weight-average molecular weight of 2,000) and 192 parts by weight of trimellitic anhydride were charged into a flask provided with a stirrer, a thermometer, a cooling tube, a distillate tube and a nitrogen gas inlet tube, and heated to 200° C. over one hour in a nitrogen gas stream while distilling of by-produced water of condensation with azeotropic distillation with toluene. The reaction mixture was kept at 200° C. for 2 hours to complete the dehydration·imidization reaction and then cooled to obtain polyoxyalkylenedimidodicarboxylic acid.

SYNTHESIS EXAMPLE 3

Synthesis of dicarboxylic acid having an oxyalkylene group 961 parts by weight of α,ω-(3-aminopropyl)-polyethyleneglycol (PEGPA-1000, trademark of Koei Kagaku Kogyo K.K., Japan, having a weight-average molecular weight of 1,100) and 38 parts by weight of trimellitic anhydride were charged into a flask provided with a stirrer, a thermometer, a cooling tube, a distillate tube and a nitrogen gas inlet tube and heated to 200° C. over one hour in a nitrogen gas stream, while distilling off by-produced water of condensation with azeotropic distillation with toluene. The reaction mixture was kept at 200° C. for 2 hours to complete the dehydrationimidization reaction and cooled to obtain polyoxyalkylenedimidocarboxylic acid.

SYNTHESIS EXAMPLE 4

Synthesis of Component (A)

64.32 parts by weight of the polyoxyalkylenediimidodicarboxylic acid obtained in Synthesis Example 1, 4.88 parts by weight of adipic acid, 6.75 parts by weight of sebacic acid, 5.54 parts by weight of isophthalic acid, 5.54 parts by weight of terephthalic acid, 0.15 parts by weight of diner acid, 6.33 parts by weight of 4,4'-diphenylmethane diisocyanate, 17.62 parts by weight of tolylene diisocyanate (2,4-isomer/6,2-isomer=80/20% by mole) and 120 parts by weight of γ-butylolactone were charged into a flask provided with a stirrer, a thermometer, a cooling to be and a nitrogen gas inlet tube and heated to 200° C. over 1.5 hours in a nitrogen gas stream, while venting the by-produced carbon dioxide gas to the outside of the system. The reaction mixture was kept at 200° C. for 3 hours to complete decarboxylation·amidization reaction and then cooled down to 130° C. to obtain an amide ligomer solution.

Then, 29.82 parts by weight of Epomic R140P (a trademark of bisphenol A type epoxy resin commercially available from Mitsui Petrochemical Industries, Ltd., Japan) and 40 parts by weight of N,N-dimethylformamide were added to the amide oligomer solution kept at 130° C., and the reaction solution was kept at 130° C. for 1.5 hours to complete hydroxyethylesterification reaction, and then cooled down to 115° C. to obtain a solution of a compound having a hydroxyl group.

Then, the nitrogen gas stream was changed to a dry air stream, and 5.83 parts by weight of methacrylic acid, 0.58 part by weight of methoquinone and 1.97 parts by weight of N,N-dimethylbenzylamine were added to the solution of the compound having a hydroxyl group kept at 115° C., and the reaction solution was kept at 115° C. for 1.5 hours to complete epoxy group-sealing reaction. Successively, 21.72 parts by weight of tetrahydrophthalic acid anhydride was added to the reaction solution kept at 115° C., which was kept at that temperature for further 2 hours to complete half-esterification reaction and then cooled down to 70° C. Then, 2.46 parts by weight of 2-isocyanatoethyl methacrylate was added to the solution kept at 70° C., which was kept at that temperature for further 1.5 hours to complete photopolymerizable unsaturated group-introducing reaction and then cooled to obtain resin having a solid acid value of 50 KOH mg/g (which will be hereinafter referred to as "A-1").

SYNTHESIS EXAMPLE 5

Synthesis of Component (A)

Resin having a solid acid value of 36 KOH mg/g (which will be hereinafter referred to as "A-2") was obtained in the same manner as in Synthesis Example 4, except that the dicarboxy acid having an oxyalkylene group obtained in Synthesis Example 1 was replaced with the dicarboxylic acid having an oxyalkylene group obtained in Synthesis Example 2, and 29.82 parts by weight of Epomic R140P was changed to 17.89 parts by weight, 21.72 parts by weight of tetrahydrophthalic anhydride to 13.03 parts by weight, and 2.46 parts by weight of 2-isocyanatoethyl methacrylate to 1.48 parts by weight.

SYNTHESIS EXAMPLE 6

Synthesis of Component (A)

73.93 parts by weight of the dicarboxylic acid having a polyoxyalkylene group obtained in Synthesis Example 3, 3.39 parts by weight of adipic acid, 4.69 parts by weight of sebacic acid, 3.85 parts by weight of isophthalic acid, 3.85 parts by weight of terephthalic acid, 0.28 parts by weight of dimer acid, 4.94 parts by weight of 4,4'-diphenylmethane diisocyanate, 13.75 parts by weight of tolylene diisocyanate (2,4-isomer/2,6-isomer=80/20% by mole) and 122.2 parts by weight of γ-butyrolactone were charged into a flask provided with a stirrer, a thermometer, a cooling tube, and a nitrogen gas inlet tube and heated to 200° C. over one hour in a nitrogen gas stream, while venting the by-produced carbon dioxide gas to the outside of the system. The reaction mixture was kept at 200° C. for 3 hours to complete decarboxylation·amidization reaction and then cooled down to 130° C. to obtain an amide oligomer solution.

Then, 0.51 parts by weight of Epomic R301 (trademark of bisphenol A type epoxy resin commercially available from Mitsui Petrochemical Industries, Ltd., Japan), 69.89 parts by weight of Epotohto YDF-2001 (trademark of bisphenol F type, epoxy resin commercially available from Tohto Kasei Co., Ltd., Japan) and 93.3 parts by weight of N,N-dimethylformamide were added to the amide oligomer solution kept at 130° C. and was kept at the same temperature for further 2.5 hours to complete hydroxyethylesterification reaction and then cooled to 115° C. to obtain a solution of compound having a hydroxyl group.

Then, the nitrogen gas stream was replaced with a dry air stream, and then 3.33 parts by weight of methacrylic acid, 0.022 part by weight of methoquinone and 2.19 parts by weight of N,N-dimethylbenzylamide were added to the solution of the compound having a hydroxyl group kept at 115° C., which was kept at that temperature for further 3 hours to complete epoxy group-sealing reaction.

Successively, 45.73 parts by weight of tetrahydrophthalic anhydride was added to the solution kept at 115° C. and was kept at that temperature for further one hour to complete, half-esterification reaction, thereby obtaining resin having a solid acid value of 77 KOH mg/g (which will be hereinafter referred to as "A-3").

SYNTHESIS EXAMPLE 7

6.97 parts by weight of adipic acid, 9.53 parts by weight of sebacic acid, 7.92 parts by weight of isophthalic acid, 7.92 parts by weight of terephthalic acid, 0.17 parts by weight of dimer acid, 7.51 part by weight of 4,4'-diphenylmethane diisocyanate, 20.90 part by weight of tolylene diisocyanate (2,4-isomer/2,6-isomer=80/20% by mole) and 72 parts by weight of γ-butyrolactone were charged into a flask provided with a stirrer, a thermometer, a cooling tube and a nitrogen gas inlet tube and heated to 200° C. over 1.5 hours in a nitrogen gas stream while venting the by-produced carbon dioxide gas to the outside of the system. The reaction mixture was kept at 200° C. for 2 hours to complete decarboxylation·amidization reaction, and then cooled down to 130° C. to obtain a polyamide intermediate solution.

Then, 25.49 parts by weight of Epomic R140P (trademark of bisphenol A type, epoxy resin commercially available from Mitsui Petrochemical Industries, ltd., Japan) and 72 parts by weight of N,N-dimethylformamide were added to the polyamide intermediate solution kept at 130° C., which was kept at that temperature for further 1.5 hours to complete hydroxyethylesterification reaction, and then cooled down to 115° C. to obtain a solution of polyamide-based resin intermediate.

Then, the nitrogen gas stream was replaced with a dry air stream and 4.96 parts by weight of methacrylic acid, 0.50 part by weight of methoquinone and 1.48 parts by weight of N,N-dimethylbenzylamine were added to the solution of polyamide-based resin intermediate kept at 115° C., and kept at that temperature for further 1.5 hours to complete epoxy group-sealing reaction.

Successively, 18.58 parts by weight of tetrahydrophthalic anhydride was added to the solution kept at 115° C., which was kept at that temperature for further 2 hours to complete half-esterification reaction and then cooled down to 70° C. Then, 2.09 parts by weight of 2-isocyanatoethyl methacrylate was added to the solution kept at 70° C., which was kept at that temperature for further 1.5 hours to complete photopolymerizable unsaturated group-introducing reaction and, then cooled to obtain resin having a solid acid value of 69 KOH mg/g (which will be hereinafter referred to a "A-4").

Example 1

Materials shown in Tables 1 and 2 were mixed together to prepare a solution of photosensitive resin composition.

TABLE 1

| | Materials | Mixing Proportion (parts by weight) |
|---|---|---|
| Component | A-1 | 70 (solid matters) |
| Component (B) | 2,2-bis((4-methacryloxypentaethoxy)phenyl)propane (BPE500, | 30 |

TABLE 1-continued

| Materials | | Mixing Proportion (parts by weight) |
|---|---|---|
| | trademark of product made by Shin-Nakamura Chemical Co., Ltd. Japan) | |
| Component (C) | 2,2'-bis(o-chlorophenyl)-4,5,4',5'-tetraphenyl-1,2'-biimidazole (made by Esprit Chemical Co., Ltd.) | 2 |
| | N-phenylglycine | 0.05 |
| | 4,4'-bis(diethylamino)benzophenone | 0.1 |

TABLE 2

| | Materials | Mixing Proportion (parts by weight) |
|---|---|---|
| Other components | Polyvinylpyrrolidone K120 (made by ISP Co., Ltd.) | 5 |
| | p-Toluenesulfoneamide | 5 |
| | Cymel 300 (made by Mitsui Cytec, Ltd.) | 10 |
| | PX200 (made by Daihachi Kagaku Kogyo K.K.) | 20 |
| | Malachite green | 0.05 |
| | Methyl ethyl ketone | 30 |

The resulting solution of photosensitive resin composition was uniformly applied to a polyethylene terephthalate film having a thickness of 20 μm and dried in a hot air connection type, drier at 80°–110° C. for 10 minutes to remove the solvent. The dried photosensitive resin composition layer was about 50 μm in thickness. A polyethylene film having a thickness of about 25 μm was further pasted as a protective film onto the photosensitive resin composition layer to obtain a photosensitive element of the present invention.

The photosensitive element so obtained was evaluated as to circuit conformability (or embeddability), photosensitive characteristics, solder reflow heat resistance after resist formation, folding endurance, nonflammability and preservation stability, and results of evaluation are shown in Table 4.

Examples 2 to 5 and Comparative Examples 1 and 2

Photosensitive elements were prepared in the same manner as in Example 1, except that the materials and mixing proportions were changed to those shown in Table 3, and processed into coverlays were and evaluated in the same manner as in Example 1. The results are shown in Table 4.

TABLE 3

| | | | Ex. 1 | Ex. 2 | Ex. 3 | Ex. 4 | Ex. 5 | Comp. Ex. 1 | Comp. Ex. 2 |
|---|---|---|---|---|---|---|---|---|---|
| Mixing proportion (Parts by weight, solid matters) | Component (A) | A-1 | 70 | — | — | — | 70 | — | — |
| | | A-2 | — | 70 | — | 70 | — | — | — |
| | | A-3 | — | — | 70 | — | — | — | — |
| | | A-4 | — | — | — | — | — | 70 | 50 |
| | Component (B) | BPE500 | 30 | — | 30 | 30 | 30 | — | 50 |
| | | TM-A | — | 30 | — | — | — | 30 | — |
| | Component (C) | 2,2'-Bis(o-chlorophenyl)4,5,4',5'-tetraphenyl-1,2'-biimidazole | 2 | — | 2 | 2 | — | 2 | — |
| | | N-phenylglicine | 0.05 | — | 0.05 | 0.05 | — | 0.05 | — |
| | | Benzophenone | — | 5 | — | — | 5 | — | 5 |
| | | EAB | 0.1 | 0.1 | 0.1 | 0.1 | 0.1 | 0.1 | 0.1 |
| | Others | Polyvinylpyrrolidone K120 | 5 | 5 | 5 | 5 | 5 | 5 | 5 |
| | | p-Toluenesulfoneamide | 5 | — | — | — | 5 | 5 | 5 |
| | | Cymel 300 | 10 | 10 | 10 | 10 | 10 | 10 | 10 |
| | | PX200 | 20 | — | 20 | 20 | — | 20 | — |
| | | FG3000 | — | 15 | — | — | 15 | — | 15 |
| | | Malachite green | 0.05 | 0.05 | 0.05 | 0.05 | 0.05 | 0.05 | 0.05 |
| | | Methyl ethyl ketone | 30 | 30 | 30 | 30 | 30 | 30 | 30 |

In Table 3, TM-A is an urethane acrylate compound synthesized from 2 moles of trimethylhexamethylene diisocyanate, 2 moles of 2-hydroxyethyl methacrylate and one mole of cyclohexanedimethanol; EAB is 4,4'-bis (diethylamino) benzophenone and FG 3000 is a halogen-based flame retardant commercially available from Teijin Chemicals Ltd., Japan.

TABLE 4

| | | Ex. 1 | Ex. 2 | Ex. 3 | Ex. 4 | Ex. 5 | Comp. Ex. 1 | Comp. Ex. 2 |
|---|---|---|---|---|---|---|---|---|
| Circuit embeddability | | ◯ | ◯ | ◯ | ◯ | ◯ | ◯ | ◯ |
| Photosensitive | Alkali developability | ◯ | ◯ | ◯ | ◯ | ◯ | x | x |

TABLE 4-continued

|  |  | Ex. 1 | Ex. 2 | Ex. 3 | Ex. 4 | Ex. 5 | Comp. Ex. 1 | Comp. Ex. 2 |
|---|---|---|---|---|---|---|---|---|
| characteristics | Sensitivity (mJ/cm$^2$) | 100 | 100 | 100 | 100 | 100 | — | — |
|  | Resolution | 70 | 70 | 70 | 70 | 70 | — | — |
| Solder reflow heat resistance | | ○ | ○ | ○ | ○ | ○ | ○ | ○ |
| Solvent resistance | | ○ | ○ | ○ | ○ | ○ | Δ | Δ |
| Folding endurance | | ○ | ○ | ○ | ○ | ○ | ○ | ○ |
| Nonflammability | | V-0 | V-0 | V-0 | V-0 | V-0 | V-0 | V-0 |
| Preservation stability | | ○ | ○ | ○ | ○ | ○ | ○ | ○ |

Remarks:
○: good
Δ: poor
x: impossible to develop (1) Circuit embeddability

For circuit embeddability tests of the photosensitive elements prepared in the foregoing Examples 1 to 5 and Comparative Examples 1 and 2, the following substrate sheets for flexible printed circuit boards were used, each of which comprised a polyimide base sheet and a 35 μm thick copper foil laminated to the base sheet (F30VC125RC11, trademark of a product made by Nikkan Kogyo K.K., Japan), on whose 35 μm—thick copper foil were formed 3 kinds of test copper circuit patterns with lines/spaces (μm)= 165/165, 318/318 and 636/636 by etching. The photosensitive elements were laminated to the test copper circuit pattern side of the individual substrate sheets at a heat shoe temperature of 120° C., a lamination speed of 0.5 m/s, a surrounding atmospheric pressure of not more than 4,000 Pa and a bonding pressure of 3.0×10$^5$ Pa, using a continuous vacuum laminator (Model VLM-1, trademark of a product made by Hitachi Chemical Co., Ltd., Japan), while peeling the polyethylene films off from the individual photosensitive elements so as to leave the photosensitive resin compositions on the test pattern sides of the individual substrate sheets.

Then, the three kinds of the test patterns under the photosensitive resin compositions as coverlays were examined by a stereomicroscope to investigate whether there were residues such as residual foams, etc. in the coverlays on and around the copper circuit patterns and at the same time test samples were cut out from the coverlays including the three kinds of test copper circuit patterns to prepare samples for examination of the coverlays with the copper circuit pattern cross-sections by an epoxy molding procedure. Examination was made as to the conformity state of coverlays with the copper circuit patterns on and around the copper circuit patterns by an electron microscope to evaluate the circuit embeddability of the photosensitive resin compositions as coverlays on the basis of the following evaluation criteria:

Good as indicated by circle mark O in Table 4:
   no residual foams and no clearances were observed in the coverlays on and around the test copper circuits patterns.
Poor as indicated by triangle mark Δ in Table 4:
   residual foams or clearances were observed in the coverlays on and around the test copper circuit patterns.

(2) Photosensitive characteristics (alkali developability, sensitivity and resolution)

For photosensitive characteristics tests of the photosensitive elements, the following substrate sheets for flexible printed circuit boards were used, each of which comprised a polyimide base sheet and a 35 μm—thick copper foil laminated to the base sheet (F30VC125RC11, trademark of a product made by Nikkan Kogyo K.K., Japan), whose copper foil surface was polished with an abrasive grain bruch, washed with water and dried before the tests. The photosensitive elements were laminated to the copper foil side of the individual substrate sheets at a heat shoe temperature of 120° C., a lamination speed of 0.5 m/s, a surrounding atmospheric pressure of not more than 4,000 Pa and a bonding pressure of 3.0×10$^5$ Pa, while peeling the polyethylene films off from the individual photosensitive elements so as to leave the photosensitive resin compositions on the copper foil sides of the individual substrate sheets, thereby obtaining test samples.

Then, a Kodak step tablet No. 2 (step tablet with 21 steps made by Eastman Kodak Co., USA) was bonded to the polyethylene terephthalate films of the test samples so obtained and the test samples were subjected to light exposure with a predetermined irradiation dosage, using a light exposure unit (Model HMW-201GZ, a product made by ORC Seisakusho, Ltd., Japan) and then to spray development with an aqueous 1 wt. % sodium carbonate solution as an alkali developing solution at 30° C. for 120 seconds, where the necessary irradiation dosage for obtaining 8 steps of the step tablet was measured as sensitivity.

Furthermore, a phototool (phototool having a Kodak step tablet No. 2 and a negative pattern with patterns of lines/ spaces (μm)=30/30–250/250 (resolution) and patterns of lines/spaces (μm)=30/400–250/400 (adhesion) was bonded to the polyethylene terephthalate films of the test samples, and the test samples were subjected to light exposure with a irradiation dosage for obtaining 8 steps of the step tablet and then to development, where figures of lines/spaces in the smallest resolution pattern for obtaining a rectangular resist shape were measured as resolution.

(3) Solder reflow heat resistance

The photosensitive elements were laminated to the substrate sheets for flexible printed circuit boards to prepare test samples, and a test negative mask was bonded to the polyethylene terephthalate films of the individual test samples, which were then subjected to light exposure with an irradiation dosage for obtaining 8 steps of the step tablet in the same manner as in (2). After being left standing at the ambient temperature for one hour, the polyethylene terephthalate films were peeled off from the samples, which were then developed with an aqueous 1 wt. % sodium carbonate solution as an alkali developing solution and dried at 80° C. for 10 minutes. Then, the test samples were subjected to ultraviolet ray irradiation at 3 J/cm², using an ultraviolet irradiation unit made by Toshiba Denzai K.K., Japan and further to heat treatment at 150° C. for 45 minutes to obtain test flexible printed circuit boards samples with a coverlay.

Then, a rosin-based flux (MH-820V, trademark of a product made by Tamura Kaken K.K., Japan) was applied to the test flexible printed circuit board samples, which were then subjected to soldering treatment by dipping in a solder bath at 260° C. for 30 seconds. After the soldering treatment, crack generation state of coverlays and releasing or peeling state of coverlays from the test samples were visually evaluated on the basis of the following evaluation criteria:

Good as indicated by circle O in Table 4:

No cracking, releasing and peeling of coverlay were observed.

Poor as indicated by triangle mark Δ in Table 4:

Cracking, releasing and peeling of coverlay were observed.

(4) Solvent resistance

The test flexible printed circuit board samples with a coverlay prepared in the same manner as in (3) were dipped in methyl ethyl ketone and isopropyl alcohol at room temperature for 10 minutes and releasing and peeling states of coverlays from the test board samples were visually evaluated on the following evaluation criteria:

Good as indicated by circle mark O in Table 4:

No releasing and peeling of coverlays were observed.

Poor as indicated by triangle mark Δ in Table 4:

Releasing and peeling of coverlays were observed.

(5) Folding endurance

Test samples with a coverlay on the substrate sheet for flexible printed circuit boards and with a solder prepared in the same manner as in (3) were subjected to 180° bending traversly, and crack generation state of bent coverlays was visually evaluated on the basis of the following evaluation criteria:

Good as indicated by circle mark O in Table 4:

No cracking of coverlays was observed.

Poor as indicated by triangle mark Δ in Table 4:

Cracking of coverlays was observed.

(6) Nonflammability

Copper foils were removed from substrate sheets for flexible printed circuit boards (F30VC125RC11, trademark of a product made by Nikkan Kogyo K.K., Japan) and the photosensitive elements were laminated to the resulting individual polyimide base sheets with an adhesive at a heat shoe temperature of 120° C., a lamination speed of 0.5 m/s, a surrounding atmospheric pressure of not more than 4,000 Pa and a bonding pressure of $2.94 \times 10^5$ Pa, while peeling the polyethylene films off from the individual photosensitive elements so as to leave the photosensitive resin composition on the polyimide base sheets, and then subjected to light exposure with such an irradiation dosage as to obtain 8 steps of a step tablet. After being left standing at the ambient temperature for one hour, the polyethylene terephthalate films were peeled off from the test samples, developed with an aqueous 1 wt. % sodium carbonate solution as an alkali developing solution and dried at 80° C. for 10 minutes. Then, the test samples were subjected to ultraviolet ray irradiation with 3 J/cm², using an ultraviolet ray irradiation unit made by Toshiba Denzai K.K., Japan and further to heat treatment at 150° C. for 45 minutes to obtain flexible printed circuit boards with a coverlay, whose nonflammability was evaluated according to UL94 Test Standard.

(7) Preservation stability

Rolled photosensitive elements, 90 m in length, were preserved at a temperature of 23° C. and a relative humidity of 60% and bleeding state of the photosensitive layer from roll sides was visually evaluated over 6 months on the basis of the following evaluation criteria:

Good as indicated by circle mark O in Table 4:

No bleeding of the photosensitive layer was observed even after 6 months.

Poor as indicated by triangle mark Δ in Table 4:

Bleeding of the photosensitive layer was observed within 6 months.

As is apparent from Table 4, the present photosensitive resin composition and photosensitive element can undergo alkali development and have good solder reflow heat resistance and folding endurance, and a coverlay for a flexible printed circuit board with an nonflammability of 94V-O (UL test standard) can be obtained.

The photosensitive resin compositions according to the first and second embodiments of the present invention have an alkali developability, an efficient pattern formability by photolithography and good sensitivity, photocurability and applicability to a film, where the curing products have good folding endurance, solder temperature resistance, solvent resistance, adhesibility and nonflammability.

The photosensitive resin composition according to the third embodiment of the present invention has better effect, folding endurance and solder reflow heat resistance than those of the invention as described in the first embodiment.

The photosensitive element according to the fourth embodiment of the present invention has good sensitivity and, photocurability, efficient pattern formability by photolithography and good folding endurance, solder reflow heat resistance, solvent resistance, adhesibility, nonflamability, handling and laminatability to a substrate.

The photosensitive laminate according to the fifth embodiment of the present invention has good sensitivity and photocurability, efficient pattern formability by photolithography, and good folding endurance, solder reflow heat resistance, nonflammability, handling and productivity of flexible printed circuit boards.

The photosensitive laminate according to the sixth embodiment of the present invention has much better sensitivity and photocurability, efficient pattern formability by photolithography, good folding endurance, solder reflow heat resistance, solvent resistance, adhesibility and nonflammability, much better handling and good productivity of flexible printed circuit boards.

The process for producing a flexible printed circuit board according to the seventh embodiment of the present invention has good folding endurance, solder reflow heat resistance, solvent resistance and nonflammability and also good high density mountability and electrical reliability with good workability in good yield.

The process for producing a flexible printed circuit board according to the eighth embodiment of the present invention has an effect of the same level as that of the seventh embodiment and a better solder reflow heat resistance than that of the seventh embodiment.

What is claimed is:

1. A photosensitive resin composition, which comprises (A) a resin having a main chain and having an amide bond, an oxyalkylene group and a carboxyl group, said oxyalkylene group being present in the main chain of the resin (A), (B) a photopolymerizable compound having an ethylenically unsaturated group and (C) a photopolymerization initiator.

2. A photosensitive resin composition according to claim 1, wherein 20 to 95 parts by weight of the resin (A), 5 to 80 parts by weight of the photopolymerizable compound (B), sum total of the component (A) resin and the component (B) photopolymerizable compound being 100 parts by weight, and 0.01 to 20 parts by weight of the photopolymerization initiator (C) on the basis of sum total of the resin (A) and the photopolymerizable compound (B) as 100 parts by weight.

3. A photosensitive resin composition according to claim 1, wherein the weight-average molecular weight of the resin (A) is 10,000–500,000.

4. A photosensitive resin composition according to claim 1, further comprising polyvinylpyrrolidone.

5. A photosensitive resin composition according to claim 1, further comprising a plasticizer.

6. A photosensitive resin composition according to claim 1, further comprising a heat cross-linking agent.

7. A photosensitive resin composition according to claim 1, further comprising a flame retardant.

8. A photosensitive element, which comprises a layer of a photosensitive resin composition according to claim 1 and a support film for supporting the layer.

9. A photosensitive laminate, which comprises a substrate for a flexible printed circuit board and a layer of a photosensitive resin composition according to claim 1 on the surface of the substrate.

10. A process for producing a flexible printed circuit board, which comprises imagewise irradiating a photosensitive laminate according to claim 9 with an actinic ray, followed by development, thereby forming a pattern of the photosensitive resin composition on the surface of the substrate for a flexible printed circuit board.

11. A process for producing a flexible printed circuit board according to claim 10, which further includes a step of irradiation with an actinic ray after the development or a step of post-heating after the development.

12. A process for producing a flexible printed circuit board according to claim 10, wherein the development is performed using an aqueous alkali solution or aqueous surfactant solution.

13. A photosensitive laminate, which comprises a layer of a photosensitive resin composition according to claim 1, a substrate for a flexible printed circuit board on one surface of the layer and a support film on another surface of the layer.

14. A photosensitive resin composition, which comprises (A) a resin having an amide bond, an oxyalkylene group and a carboxyl group, (B) a photopolymerizable compound having an ethylenically unsaturated group and (C) a photopolymerization initiator, wherein the resin (A) is a resin obtained by reaction of (a) dicarboxylic acid having an oxyalkylene group, (b) diisocyanate or diamine, (c) a compound having at least two epoxy groups in the molecule and (d) a polybasic carboxylic monoanhydride as essential reactants.

15. A photosensitive resin composition according to claim 14, wherein the resin (A) is represented by the formula:

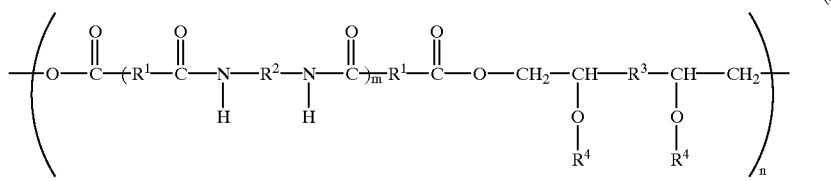

where $R^1$ is a divalent residue resulting from removal of two carboxyl groups from a dicarboxylic acid having an oxyalkylene group; $R^2$ is a diamine residue obtained by removing terminal amino groups therefrom or diisocyanate residue obtained by removing terminal isocyanate groups therefrom; $R^3$ is a divalent residue resulting from removal of two epoxy groups from a compound having at least two epoxy groups in the molecule; $R^4$ is a hydrogen atom, a group represented by the following formula:

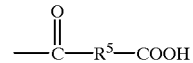

(where $R^5$ is a residue of multibasic carboxylic monoanhydride) or a group represented by the following formula:

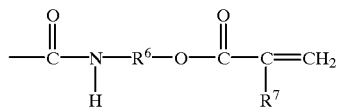

(where $R^6$ is an alkylene group having 1 to 6 carbon atoms or a single bond and $R^7$ is a hydrogen atom or a methyl group); and n and m shows each independently an integer of 1 to 100.

* * * * *

UNITED STATES PATENT AND TRADEMARK OFFICE
CERTIFICATE OF CORRECTION

PATENT NO : 6,060,215
DATED : May 9, 2000
INVENTOR(S) : J. AMANOKURA ET AL.

It is certified that error appears in the above-identified patent and that said Letters Patent are hereby corrected as shown below:

On title page, item 73 Assignee
replace "Hitachi, Ltd." with --Hitachi Chemical Company, Ltd.--.

Signed and Sealed this

Seventeenth Day of April, 2001

*Attest:*

NICHOLAS P. GODICI

*Attesting Officer*     Acting Director of the United States Patent and Trademark Office